United States Patent
Yasui

(10) Patent No.: US 6,907,385 B2
(45) Date of Patent: Jun. 14, 2005

(54) MEMORY DEFECT REDRESS ANALYSIS TREATING METHOD, AND MEMORY TESTING APPARATUS PERFORMING THE METHOD

(75) Inventor: Takahiro Yasui, Tokyo (JP)

(73) Assignee: Advantest Corporation, Tokyo (JP)

( * ) Notice: Subject to any disclaimer, the term of this patent is extended or adjusted under 35 U.S.C. 154(b) by 97 days.

(21) Appl. No.: 10/399,082

(22) PCT Filed: Oct. 19, 2001

(86) PCT No.: PCT/JP01/09217

§ 371 (c)(1),
(2), (4) Date: Apr. 11, 2003

(87) PCT Pub. No.: WO02/33708

PCT Pub. Date: Apr. 25, 2002

(65) Prior Publication Data

US 2003/0236648 A1 Dec. 25, 2003

(30) Foreign Application Priority Data

Oct. 19, 2000 (JP) .................................. 2000-318887

(51) Int. Cl.[7] .............................................. G01R 31/26
(52) U.S. Cl. .................... 702/184; 702/185; 702/186
(58) Field of Search ................................ 702/184–186; 257/E27.097; 714/704, 710, 718, 724, 733; 365/200, 201, 189.07

(56) References Cited

U.S. PATENT DOCUMENTS

| | | | | |
|---|---|---|---|---|
| 4,414,665 A | * | 11/1983 | Kimura et al. ............. | 714/719 |
| 4,460,997 A | * | 7/1984 | Harns ........................ | 714/711 |
| 4,736,373 A | * | 4/1988 | Schmidt ..................... | 714/711 |
| 5,410,687 A | * | 4/1995 | Fujisaki et al. ............. | 365/201 |
| 5,604,756 A | * | 2/1997 | Kawata ...................... | 714/773 |
| 5,717,694 A | * | 2/1998 | Ohsawa ...................... | 714/704 |
| 5,841,785 A | * | 11/1998 | Suzuki ....................... | 714/718 |
| 5,909,448 A | * | 6/1999 | Takahashi ................... | 714/719 |
| 5,917,764 A | * | 6/1999 | Ohsawa et al. ............. | 365/200 |
| 6,459,292 B1 | * | 10/2002 | Oikawa et al. ............. | 324/765 |

FOREIGN PATENT DOCUMENTS

| | | |
|---|---|---|
| JP | 10148658 | 6/1998 |
| JP | 200091388 | 3/2000 |

* cited by examiner

Primary Examiner—Carol S. W. Tsai
(74) Attorney, Agent, or Firm—David N. Lathrop, Esq.; Gallagher & Lathrop

(57) ABSTRACT

There are provided a failure repair analyzing and processing method and a memory testing apparatus provided with a failure repair analyzing and processing apparatus using this method, that are capable of reducing a time duration required to perform the failure repair analysis and processing for a multi-bit memory having redundancy structure. A plurality of repair analysis units as well as a common failure analysis memory are provided, and these repair analysis units are concurrently operated in parallel with each other, thereby to carry out respective repair analyses and processings for failure memory cells of plural data bits read out from the failure analysis memory in the plural repair analysis units concurrently and in parallel with each other. As a result, a time duration required to execute the failure repair analysis and processing is shortened.

9 Claims, 7 Drawing Sheets

MEMORY DEFECT REDRESS ANALYSIS TREATING METHOD, AND MEMORY TESTING APPARATUS PERFORMING THE METHOD

TECHNICAL FIELD

The present invention relates to a method of analyzing and processing a repair of failure in a memory, that comprises the step of analyzing as to whether a failure memory cell or cells existing in a memory having redundancy structure tested by a memory testing apparatus can be repaired or relieved or not, and a memory testing apparatus using the method.

BACKGROUND ART

Memory testing apparatuses for testing various types of semiconductor memories including, for example, a memory (IC memory) constructed by a semiconductor integrated circuit (IC) can be classified, roughly, into a memory testing apparatus for testing a memory in wafer state before packaged and a memory testing apparatus for testing a memory after packaged. The memory testing apparatus for testing a memory in wafer state before packaged differs remarkably from the memory testing apparatus for testing a memory after packaged in that the former apparatus is provided with a failure repair processing function or means that decides whether a failure memory cell or cells existing in a memory having redundancy structure described later on can be repaired or not.

In recent years, a semiconductor memory (particularly, an IC memory) has a tendency that its storage capacity is increased and that its size is miniaturized, and with the increased memory capacity and the miniaturization, a defect rate of IC memories has been increased. In order to lower the defect rate of IC memories, in other words, in order to prevent the yield of IC memories from being decreased, there has been manufactured, for example, an IC memory in which a failure memory cell or cells detected therein can be electrically replaced with a spare memory cell or cells (called a spare line, a repair line or a redundancy circuit in this technical field). An IC memory of this type that has a spare memory cell or cells (hereinafter, referred to as spare line) formed therein is called a memory having redundancy structure in this technical field, and analysis as to whether a repair of a failure memory cell or cells existing in this memory of redundancy structure can be effected or not is carried out in a failure repair analyzing and processing apparatus.

A prior memory testing apparatus provided with a failure repair analyzing and processing apparatus of this type is shown in FIG. 4 in a block diagram by a rough construction thereof. This memory testing apparatus TES comprises, roughly speaking, a main controller 111, a pattern generator 112, a timing generator 113, a waveform formatter 114, a logical comparator 115, a driver 116, an analog level comparator (hereinafter, referred to as comparator) 117, a failure analysis memory 118, a failure repair analyzing and processing apparatus 119, a logical amplitude reference voltage source 121, a comparison reference voltage source 122, and a device power source 123. Further, in the following description, a case of testing an IC memory in wafer state before packaged will be described. However, in cases of testing various kinds of semiconductor memories in wafer state before packaged in addition to IC memories, testing thereof will be carried out in the same manner.

The main controller 111 is generally constituted of a computer system and a test program PM created by a user (programmer) is previously loaded therein. This main controller 111 controls the whole of the memory testing apparatus in accordance with the test program PM. The main controller 111 is connected, via a tester bus TBUS, to the pattern generator 112, the timing generator 113, the waveform formatter 114, the logical comparator 115, the failure analysis memory 118, the failure repair analyzing and processing apparatus 119, the logical amplitude reference voltage source 121, the comparison reference voltage source 122, the device power source 123, and the like.

An IC memory to be tested (memory under test) 200 is formed into a semiconductor wafer WH in this example. Before testing of the memory under test 200 is started, various kinds of data are, at first, set from the main controller 111. The pattern generator 112 supplies test pattern data to the waveform formatter 114 in accordance with the test program PM. On the other hand, the timing generator 113 generates timing signals (clock pulses) for controlling operation timings of the waveform formatter 114, the logical comparator 115, and the like.

The waveform formatter 114 converts the test pattern data supplied from the pattern generator 112 into a test pattern signal having a real waveform. This test pattern signal is applied to the memory under test 200 via the driver 116 which in turn amplifies in voltage the test pattern signal to a waveform having an amplitude value set by the logical amplitude reference voltage source 121. The test pattern signal is stored in a memory cell of the memory under test 200, that has an address specified by an address signal, and the storage content is read out therefrom in a read cycle later on.

A response signal read out from the memory under test 200 is compared with a reference voltage supplied from the comparison reference voltage source 122 in the comparator 117, and it is determined whether or not the response signal has a predetermined logical level, i.e., whether or not the response signal has a voltage of a predetermined logical H (logical high) or a voltage of a predetermined logical L (logical low). The response signal determined to have the predetermined logical level is sent to the logical comparator 115, where the response signal is compared with an expected value signal outputted from the pattern generator 112, and it is decided whether or not the memory under test 200 has outputted a normal response signal.

If the response signal does not coincide with the expected value signal, the memory cell of the memory under test 200, that has the address from which that response signal has been read out is determined to be in failure, and a failure signal (failure data) indicating that fact is generated from the logical comparator 115.

Usually, the failure analysis memory 118 has the same operation speed and storage capacity as those of the memory under test 200, and the same address signal as an address signal applied to the memory under test 200 is applied to the failure analysis memory 118. In addition, the failure analysis memory 118 is initialized prior to starting the testing. For example, by the initialization, a data of logical "0" is written in all of the addresses of the failure analysis memory 118. Each time a failure data representing the disagreement between the response signal and the expected value signal is generated from the logical comparator 115 during the testing of the memory under test 200, a failure data (for example, logical "1" data) indicating that the tested memory cell is in failure is written in the same address of the failure analysis memory 118 as that of the memory cell of the memory under test 200 from which the disagreement has occurred.

On the contrary, when the response signal coincides with the expected value signal, the memory cell of the memory under test 200 having the address from which the response signal has been read out is determined to be normal, and a pass signal indicating that fact is generated. This pass signal is usually not stored in the failure analysis memory 118.

At the time point when the testing has been completed, the failure data stored in the failure analysis memory 118 are read out therefrom into the failure repair analyzing and processing apparatus 120, and it is decided whether the failure memory cells of the tested IC memory 200 can be repaired or not. In general, in addition to the addresses of the failure memory cells of the memory under test 200, the test patterns given to those failure memory cells are also stored in the failure analysis memory 118, and at the time point when the testing has been completed, those data are read out from the failure analysis memory 118 into the failure repair analyzing and processing apparatus 119 in which it is decided whether the failure memory cells can be relieved or repaired or not.

Further, in FIG. 4, each of the driver 116 and the comparator 117 is illustrated by one symbol. However, in practice, the number of drivers 116 provided is equal to the number of input terminals of the memory under test 200, for example, if the number of input terminals is 512, then 512 of drivers 116 are provided, and the number of comparators 117 provided is equal to the number of output terminals of the memory under test 200 (since the number of input terminals provided is usually equal to the number of output terminals, the number of comparators 117 provided is equal to the number of drivers 116 provided). In addition, though each of the waveform formatter 114, the logical comparator 115, the failure analysis memory 118, the failure repair analyzing and processing apparatus 119, etc. is also shown by one block, the remaining elements except for the main controller 111 and the timing generator 112 are usually provided as many as the number of the drivers 116 (for example, 512).

The storage area of a semiconductor memory is generally divided into a plurality of storage regions, and each storage region is constituted of a large number of memory cells aligned along row address lines and column address lines, which is called a memory cell array in this technical field. In addition, each storage region (each memory cell array) is called a block. The storage capacity of a semiconductor memory is the sum value of the memory capacities of the plural memory cell arrays.

In case of a memory having redundancy structure, each of the storage regions is provided with a desired number of column spare lines and a desired number of row spare lines formed in the row address direction and in the column address direction respectively at the periphery of the memory cell array. Each column spare line includes the same number of memory cells as that of the column address lines in the memory cell array and each row spare line includes the same number of memory cells as that of the row address lines in the memory cell array.

In addition, in case of a multi-bit memory, a memory element constituted of the above-mentioned plural memory cell arrays (hereinafter, referred to as memory cell array group) is formed on the same semiconductor chip as many as the number of bits. A multi-bit memory having redundancy structure is shown in FIG. 7.

A memory 200 shown in FIG. 7 is an (N+1)-bit memory, and a bit-1 memory cell array group 201-0 that stores data corresponding to the first data bit (bit-0), a bit-2 memory cell array group 201-1 that stores data corresponding to the second data bit (bit-1), a bit-3 memory cell array group 201-2 that stores data corresponding to the third data bit (bit-2), . . . , a bit-N memory cell array group 201-N that stores data corresponding to the (N+1)th data bit (bit-N) are formed on the same wafer WH. That is, the same number of the memory cell array groups as that of bits of a multi-bit test pattern signal to be written in the memory 200 is formed on the same wafer WH. Though these memory cell array groups are shown in three dimensional manner in FIG. 7, they are, in practice, formed in planar manner.

A plurality of (six, in this example) memory cell arrays 202 are formed in the inside of each of the plural memory cell array groups 201-0, 201-1, 201-2, . . . . In addition, a desired number of column spare lines SC and a desired number of row spare lines SR are formed in the row address direction ROW and in the column address direction COL respectively at the periphery of each memory cell array 202. Further, in this example, a case is shown that two row spare lines SR are disposed along one side in the row address direction of each memory cell array 202 and two column spare lines SC are disposed along one side in the column address direction of each memory cell array 202. However, it is needless to say that the number of spare lines and the positions where these spare lines are disposed are not limited to the example as illustrated.

FIG. 5 is a block diagram showing a rough construction of the prior art failure repair analyzing and processing apparatus 119 that is used in testing a multi-bit IC memory such as the multi-bit IC memory shown in FIG. 7, and FIG. 6 is a block diagram showing a rough construction of the prior art failure analysis memory 118 that is used in testing a multi-bit IC memory.

As shown in FIG. 6, the failure analysis memory 118 comprises: a storage part AFM provided with a data input terminal Dn, an address input terminal An, a data output terminal Qn, etc.; an address selector for selecting and taking out an address signal PADR supplied from a pattern generator 112; and a multiplexer MUX having one input terminal A to which an address signal FADR supplied from the failure repair analyzing and processing apparatus 119 is applied and the other input terminal B to which an address signal supplied from the address selector ADS is applied, the multiplexer MUX selecting either one of the address signal FADR or the address signal PADR to output the selected one.

As shown in FIG. 5, the failure repair analyzing and processing apparatus 119 comprises: a control part 10 for outputting an analysis start signal ALSRT, a bit specifying signal BITSP, a load signal LOAD, etc.; and a repair analysis unit 20 that operates under the control of the control part 10.

The repair analysis unit 20 comprises: a bit specifying part 21 constituted by a bit specifying register 21A, a group of AND gates 21B and an OR gate 21C for performing a logical addition (OR) of the AND gate group 21B; a latch circuit 22 for temporarily storing data outputted from the bit specifying part 21; an operation and processing part 23 for performing an operation or computation of data read out from the latch circuit 22; a failure block memory 25 for storing a memory cell array from which a failure memory cell is detected; and an address generator 24 for generating an address signal for accessing an address of the failure analysis memory 118 in carrying out a repair analysis and processing. The repair analysis unit 20 starts a repair analyzing operation when it receives an analysis start signal ALSRT from the control part 10, and sends an analysis end signal ALEND to the control part 10 when the repair analyzing operation for one data bit (one memory cell array group) is completed.

Into the bit specifying register 21A is loaded a bit specifying signal BITSP being applied to the data terminal thereof when a load signal LOAD is applied thereto from the control part 10, and the register 21A specifies one data bit (one of the memory cell array groups) of the memory under test 200 that a repair analysis and processing should be performed. In reality, it specifies the data bit memory area of the failure analysis memory 118 in which failure data existing in one data bit (one memory cell array group) of the memory under test 200 have been stored. Each AND gate of the AND gate group 21B has two input terminals, and a bit specifying signal BITSP from the bit specifying register 21A is applied to one input terminal of each AND gate and a failure data FAIL read out from the data output terminal Qn of the failure analysis memory 118 is sequentially applied to the other input terminal of each AND gate. Accordingly, the AND gate group 21B has the same number of AND gates provided therein as that of the data bits (the memory cell array groups) of the memory under test 200, and only one AND gate corresponding to a bit specifying signal BITSP from the bit specifying register 21A is enabled.

During the testing of the memory under test 200, the multiplexer MUX of the failure analysis memory 118 selects the other input terminal B so that the multiplexer MUX supplies address signals PADR to the address input terminal An of the storage part AFM, the address signals PADR being supplied to the other input terminal B from the pattern generator 112 through the address selector ADS. As a result, each time the disagreement occurs in the logical comparator 115, a failure data FAIL applied to the data input terminal Dn of the storage part AFM will be stored in the same address of the storage part AFM as that of the failure memory cell of the memory under test 200 from which that disagreement has occurred.

Further, in the specification, "failure data" means data that, in case the memory under test 200 is a multi-bit memory, has the same bit width as that of data read out from this memory under test 200 as well as all bits thereof are logical "0" where no disagreement occur in the logical comparator 115, and where one or more disagreements occur in the logical comparator 115, only one or more bits of the data from which the one or more disagreements have occurred are changed to logical "1". For example, in case the memory under test 200 is an eight-bit memory and is constituted of eight data bits (memory cell array groups), data of eight bits from data bit 1 to data bit 8 is written in the memory under test 200. Accordingly, where no disagreement occurs in the logical comparator 115, the failure data becomes a data of "00000000" in which all of the eight bits are logical "0". Where a disagreement is detected in the data bit 2, the failure data becomes a data of "01000000", and where a disagreement is detected in both the data bit 3 and the data bit 6, the failure data becomes a data of "00100100". Therefore, if such failure data are stored in the same addresses of the failure analysis memory 118 as the addresses of the memory under test 200 from which those failures have occurred, the failure occurrence addresses of the memory under test 200 and the locations or positions of those failure memory cells can be stored.

When the testing of the memory under test 200 has been completed, a failure repair analysis and processing of the tested memory 200 is carried out. The multiplexer MUX of the failure analysis memory 118 selects its one input terminal A so that it applies address signals FADR sent to the one input terminal A from the address generator 24 shown in FIG. 5 of the failure repair analyzing and processing apparatus 119 to the address input terminal An of the storage part AFM, thereby to access the failure data stored in the storage part AFM.

The failure data FAIL read out from the data output terminal Qn of the storage part AFM are supplied, in sequence, to the other input terminals of the AND gate group 21B of the bit specifying part 21 of the failure repair analyzing and processing apparatus 119. Since the bit specifying register 21A controls to enable only one AND gate in the AND gate group 21B corresponding to one data bit specified by the register, only the failure data (failure data of one bit) existing in the memory area of the specified data bit (memory cell array group) among the failure data FAIL read out from the storage part AFM are taken out into the latch circuit 22.

The failure data of one bit taken out into the latch circuit 22 are recognized as to in which memory cell array 202 and on which address line of the recognized memory cell array they exist on the basis of address signals generated from the address generator 24, and further, the location (address) of the failure memory cell on that recognized address line is specified and is sent to the operation and processing part 23. The operation and processing part 23 adds up in number the failure data taken therein in each address line for each memory cell array 202, and operates or computes and processes as to whether the address line on which one or more failure memory cells exist can be repaired by use of spare lines SC, SR provided on each memory cell array 202.

Moreover, the operation and processing part 23 reads out the stored data in the failure block memory 25 therefrom, and if there is a memory cell array from which any failure memory cell has not been detected, the operation and processing part 23 controls such that the address generator 24 does not generate an address signal to access the memory cell array from which any failure memory cell has not been detected and generates an address signal to access a subsequent memory cell array to be analyzed and processed next time from which a failure memory cell or cells have been detected. That is, the repair analysis and processing for each of memory cell arrays from which no failure memory cell has been detected is not carried out and the repair analysis and processing for a subsequent memory cell array to be analyzed and processed next time is executed at once.

In the prior art failure repair analyzing and processing method described above, failure data in a data bit (memory cell array group) specified by the bit specifying part 21 are read out one bit by one bit using address signals and are sent to the operation and processing part 23. Specifically explaining, in case of a multi-bit memory under test 200 shown in FIG. 7, a plurality of memory cell array groups 201-0, 201-1, 201-2, ..., 201-N are specified one memory cell array group by one memory cell array group by the bit specifying part 21, and the repair analysis and processing for (N+1) memory cell array groups 201-0, 201-1, 201-2, ..., 201-N is carried out one group by one group. Accordingly, there is a disadvantage that a time required to execute the repair analysis and processing for (N+1) memory cell array groups comes to considerably long.

Furthermore, in case of testing a large number of multi-bit memories each having redundancy structure at the same time, the failure analysis memory 118 shown in FIG. 6 and the failure repair analyzing and processing apparatus 119 shown in FIG. 5 are provided for each memory under test.

These large number of the failure analysis memories 118 and the failure repair analyzing and processing apparatuses 119 are concurrently operated in parallel with one another so that the failure repair analysis and processing for each of the large number of memories under test is carried out.

In such case, a failure repair analyzing and processing apparatus that executes the failure repair analysis and processing for a memory under test in which many failure memory cells exist becomes naturally long in its processing time, and hence the processing speed thereof is lowered. As a result, in case the failure repair analysis and processing for each of the remaining memories under test has been completed, the failure repair analyzing and processing apparatuses that have completed the failure repair analysis and processing are stopped to operate, and the failure repair analysis and processing for a memory under test in which many failure memory cells exist is continued in the state that the failure repair analyzing and processing apparatuses that have completed the failure repair analysis and processing are waiting on. Accordingly, even there exists only one failure repair analyzing and processing apparatus that takes a long time to carry out the failure repair analysis and processing for a memory under test, the failure repair analysis and processing time for the whole apparatuses comes to the failure repair analysis and processing time for the failure repair analyzing and processing apparatus that has taken the longest time, which results in a shortcoming that the failure repair analysis and processing cannot be carried out at high speed.

Recently, since the storage capacity of a memory is increasing more and more and the number of bits of a memory is also increasing, there has been a tendency that the failure repair analysis and processing time for a memory having redundancy structure is still more increased. For this reason, it is strongly demanded that the failure repair analysis and processing can be performed at high speed.

DISCLOSURE OF THE INVENTION

It is an object of the present invention to provide a failure repair analyzing and processing method by which the failure repair analysis and processing for a memory having redundancy structure can be carried out at high speed.

It is another object of the present invention to provide a memory testing apparatus provided with a failure repair analyzing and processing apparatus that is capable of carrying out at high speed the failure repair analysis and processing for a memory having redundancy structure.

In order to accomplish the aforesaid objects, in one aspect of the present invention, there is provided a method of analyzing and processing a repair of failure that is carried out in a memory testing apparatus which comprises: a failure analysis memory for storing therein failure data representing a failure memory cell or cells of a memory under test having redundancy structure; and a failure repair analyzing and processing apparatus for analyzing as to whether the failure memory cell or cells of the memory under test can be repaired on the basis of the failure data read out from the failure analysis memory after the testing has been completed, the method comprising the steps of: reading out failure data respectively from plural specified data bit memory areas of the failure analysis memory in sequence and distributing them to corresponding plural repair analysis units respectively; and operating concurrently the plural repair analysis units in parallel with each other and causing the units to carry out concurrently their repair analyses and processings for the failure memory cell or cells corresponding to the failure data read out from the failure analysis memory in parallel with each other.

In a preferred embodiment, the aforesaid failure repair analyzing and processing method further includes: the step of checking whether there exists an unprocessed data bit memory area for which the repair analysis and processing is not executed or not, and in case an unprocessed data bit memory area has been detected, each of the repair analysis units performs, when it has completed the repair analysis and processing for failure data of a data bit memory area assigned to that unit, the repair analysis and processing for failure data of the detected unprocessed data bit memory area at once.

In addition, the step of reading out failure data respectively from plural specified data bit memory areas of the failure analysis memory in sequence includes the step of: switching in sequence respective address signals accessing to plural specified data bit memory areas, that are outputted respectively from the plural repair analysis units to apply them to the failure analysis memory, and the period that the plural address signals are switched in sequence is a period that the period of each address signal accessing to corresponding one specified data bit memory area is divided by the number of specified data bit memory areas, and the failure data read out from the failure analysis memory are failure data that are switched in sequence at intervals of the same period as the switching period of the address signals applied to the failure analysis memory.

In another aspect of the present invention, there is provided a memory testing apparatus which comprises: a failure analysis memory for storing therein failure data representing a failure memory cell or cells of a memory under test having redundancy structure; a plurality of repair analysis units, each being constructed such that it specifies any data bit memory area in plural data bit memory areas of the failure analysis memory, reads out failure data stored in the specified data bit memory area in respective failure data stored in the plural data bit memory areas of the failure analysis memory, and analyzes as to whether a memory cell array or arrays associated with the read-out failure data can be repaired or not; access control means for switching in sequence respective address signals outputted from the plural repair analysis units to apply them to the failure analysis memory in sequence; data distributing means for distributing respective failure data read out from the plural specified data bit memory areas of the failure analysis memory to the corresponding plural repair analysis units, respectively; and a control part that controls respective repair analysis and processing operations of the plural repair analysis units.

In a preferred embodiment, each of the plural repair analysis units is provided with its own address generator, and each repair analysis unit can access the failure analysis memory separately and independently of the operation of other repair analysis unit or units by generating an address signal accessing to a specified data bit memory area from its own address generator.

The access control means is arranged such that it switches in sequence respective address signals accessing to plural specified data bit memory areas, that are outputted respectively from the plural repair analysis units to apply them to the failure analysis memory, and the period that the plural address signals are switched in sequence is a period that the period of each address signal accessing to corresponding one specified data bit memory area is divided by the number of specified data bit memory areas, and the failure data read out from the failure analysis memory are failure data that are switched in sequence at intervals of the same period as the switching period of the address signals applied to the failure analysis memory.

The control part applies respective analysis start signals, respective bit specified signals, and respective load signals to the plural repair analysis units, respectively, and receives a analysis end signal from each of the plural repair analysis units, thereby to control respective repair analysis and processing operations of the plural repair analysis units.

In addition, the control part further comprises: unprocessed data bit detecting means for detecting, each time a repair analysis unit that has completed the repair analysis and processing operation for a memory cell array or arrays associated with failure data of a specified data bit memory area transmits an analysis end signal, whether there exists an unprocessed data bit memory area for which the repair analysis and processing is not executed or not; and data bit update means for updating, in case an unprocessed data bit memory area has been detected, a bit specifying signal being applied to a repair analysis unit that has completed the repair analysis and processing operation to a bit specifying signal to be applied to the unprocessed data bit memory area.

In case the memory under test is a multi-bit memory, the failure analysis memory includes at least the same number of data bit memory areas as the number of bits of the memory under test, and failure data of each of the data bits of the multi-bit memory under test are stored in corresponding one data bit memory area of the failure analysis memory.

In case the memory under test is a one-bit memory, the failure analysis memory includes at least the same number of data bit memory areas as the number of memory cell arrays of the memory under test, and failure data of each of the memory cell arrays of the memory under test are stored in corresponding one data bit memory area of the failure analysis memory.

In accordance with the failure repair analyzing and processing method according to the present invention and the memory testing apparatus using this method, since respective repair analyses and processings for a plurality of data bits or a plurality of memory cell arrays can be concurrently carried out, if the number of failure repair analysis units is N, the failure repair analysis and processing can be executed at high speed as many as N times.

Moreover, each of the repair analysis units operates independently, and when one repair analysis unit has completed the repair analysis and processing operation for a data bit or memory cell array assigned thereto, it executes the repair analysis and processing operation for the next unprocessed data bit or memory cell array. Accordingly, even if there occurs a delay in completion of the repair analysis and processing operation of one repair analysis unit because it performs the repair analysis and processing for a memory cell array in which many failure memory cells exist and it takes a long time in the repair analysis and processing thereof, the remaining repair analysis unit or units carry out the failure repair analysis and processing for an unprocessed data bit or memory cell array in sequence. As a result, even if a number of failure memory cells exist biasedly in a specified memory cell array, the whole repair analysis and processing time is considerably shortened. Thus, it is possible to remove the prior art disadvantages.

BEST MODE FOR CARRYING OUT THE INVENTION

Now, a preferred embodiment of the present invention will be described in detail with reference to FIGS. 1 to 3. The present invention may, however, be embodied in many different forms and should not be construed as limited to the embodiment set forth hereinafter; rather, the embodiment described later on is provided so that this disclosure will be thorough and complete, and will fully convey the scope of the invention to those skilled in the art.

Figure 1:
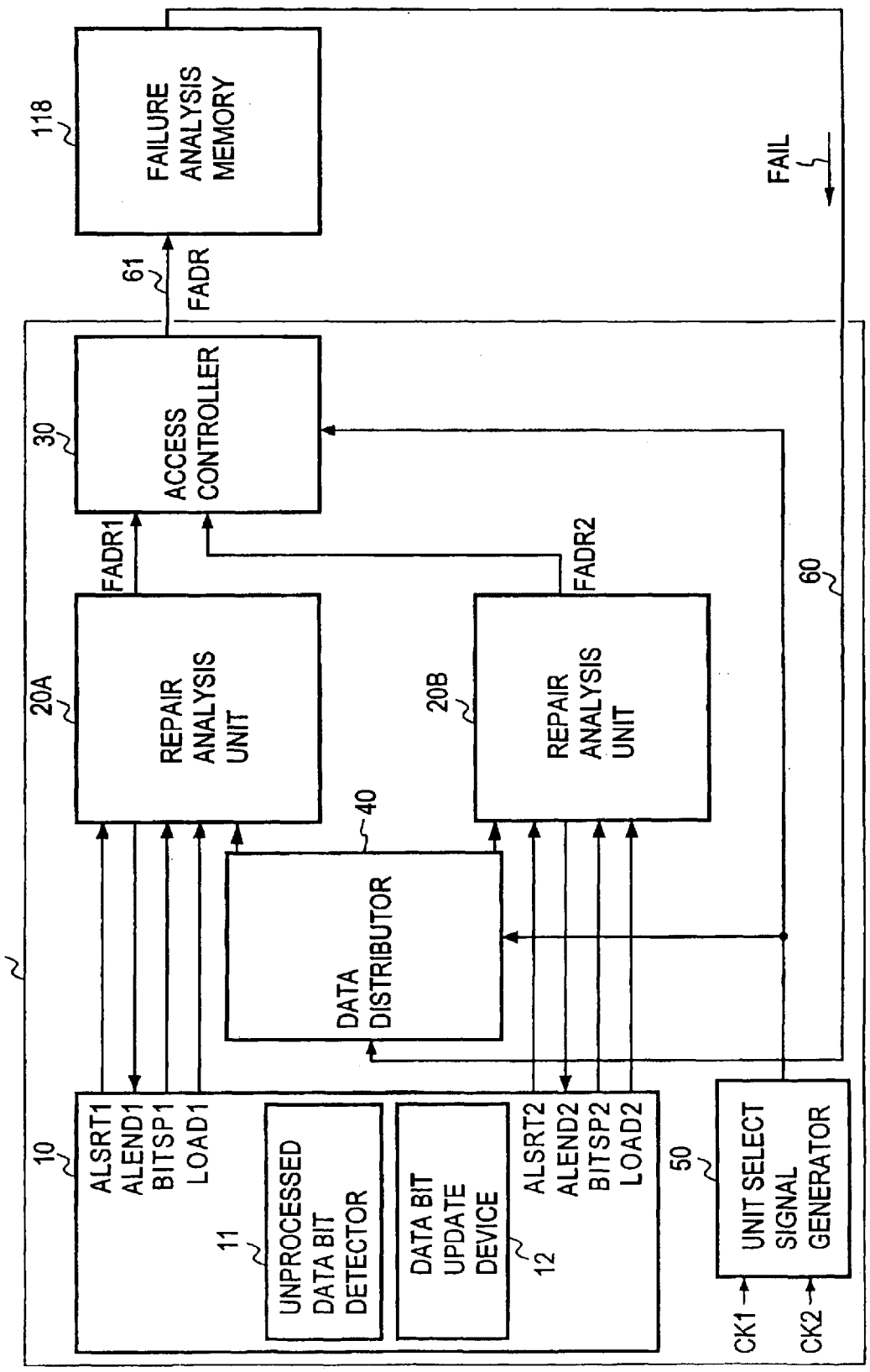
FIG. 1 is a block diagram showing a rough construction of an embodiment of the memory testing apparatus according to the present invention that is provided with a failure repair analyzing and processing apparatus using a method of analyzing and processing a repair of failure in a memory according to the present invention.
Figure 2:
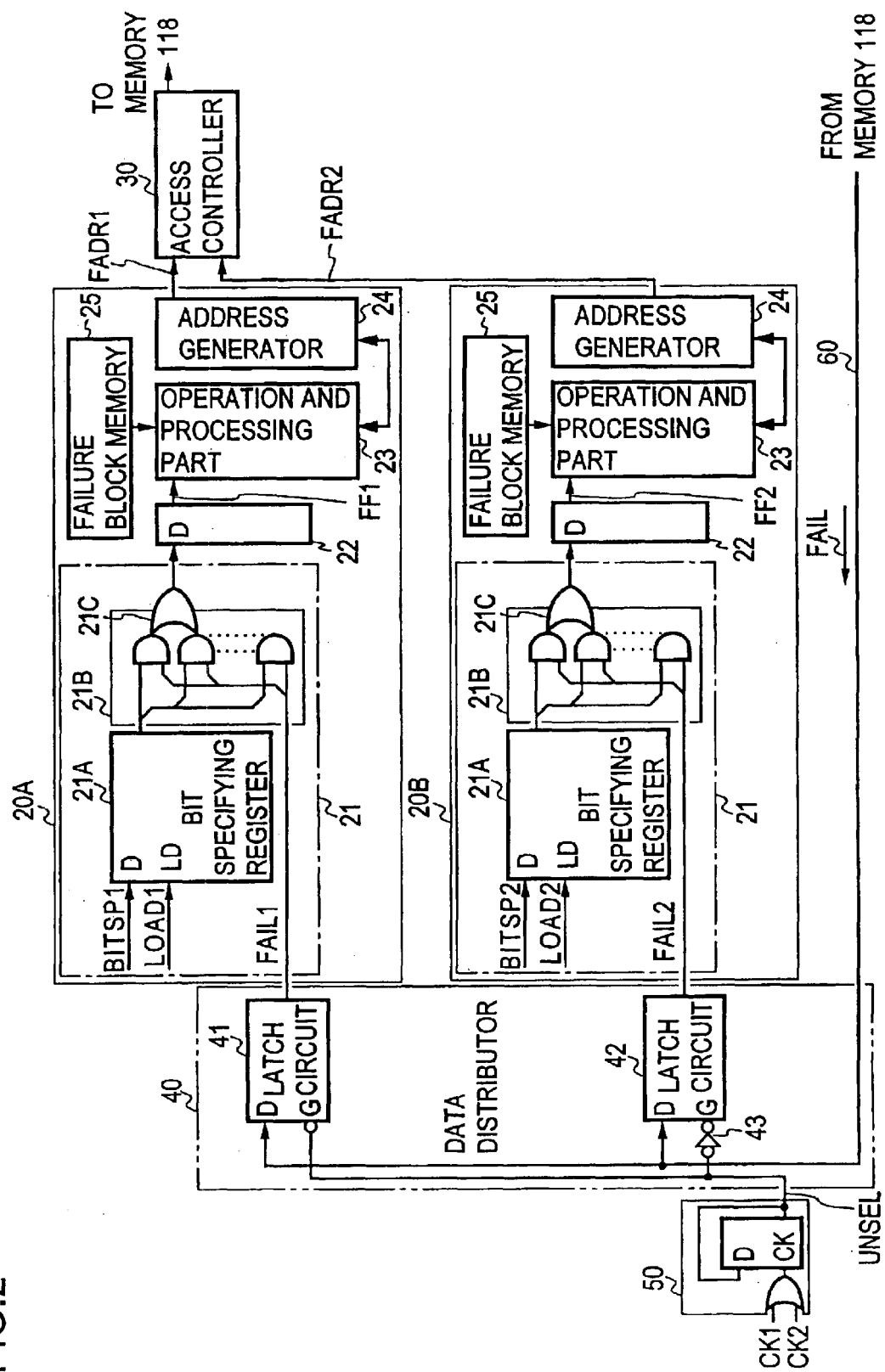
FIG. 2 is a block diagram showing a detailed construction of the failure repair analyzing and processing apparatus shown in FIG. 1.
Figure 3:
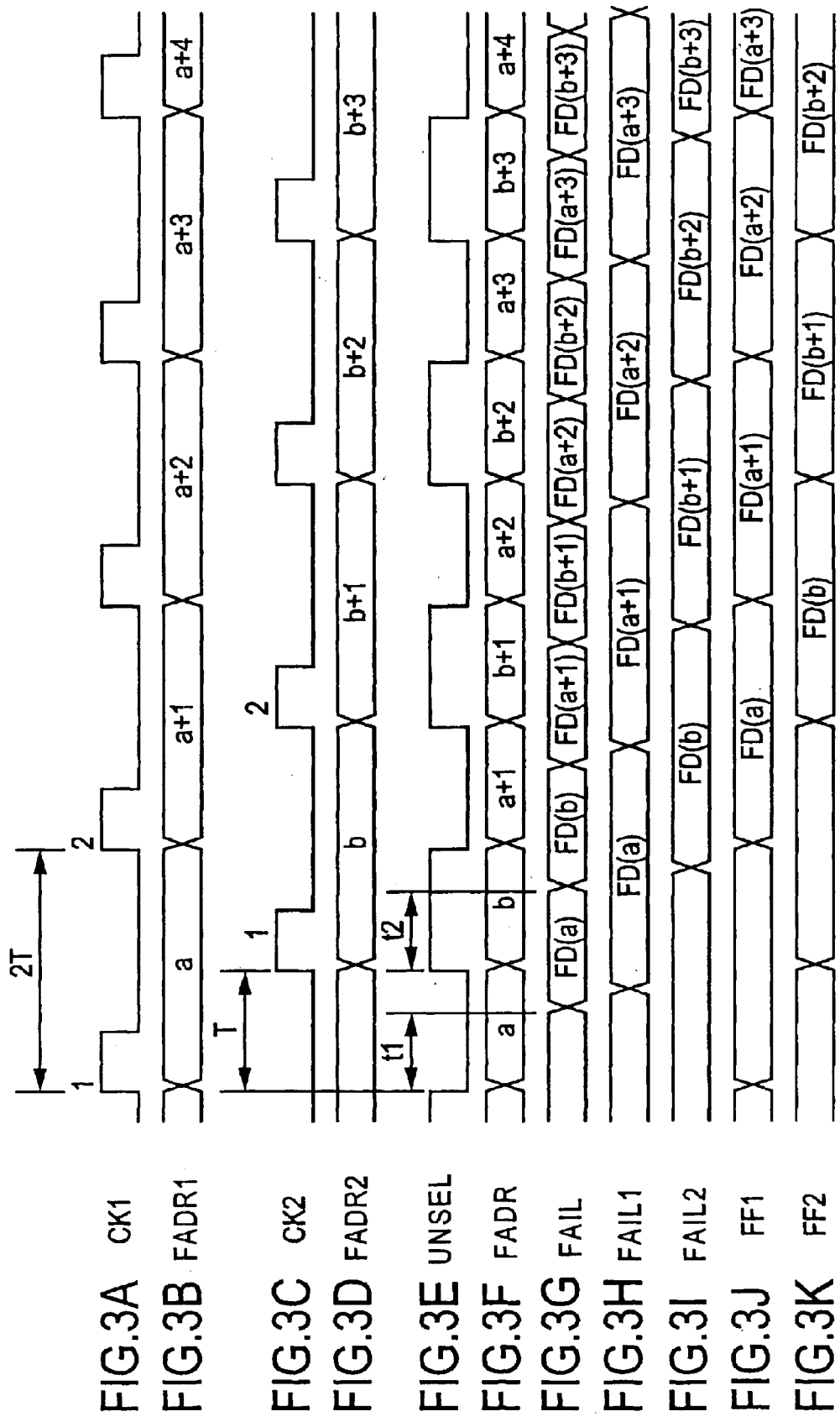
FIG. 3 is a timing chart for explaining the operation of the failure repair analyzing and processing apparatus shown in FIG. 2.
Figure 4:
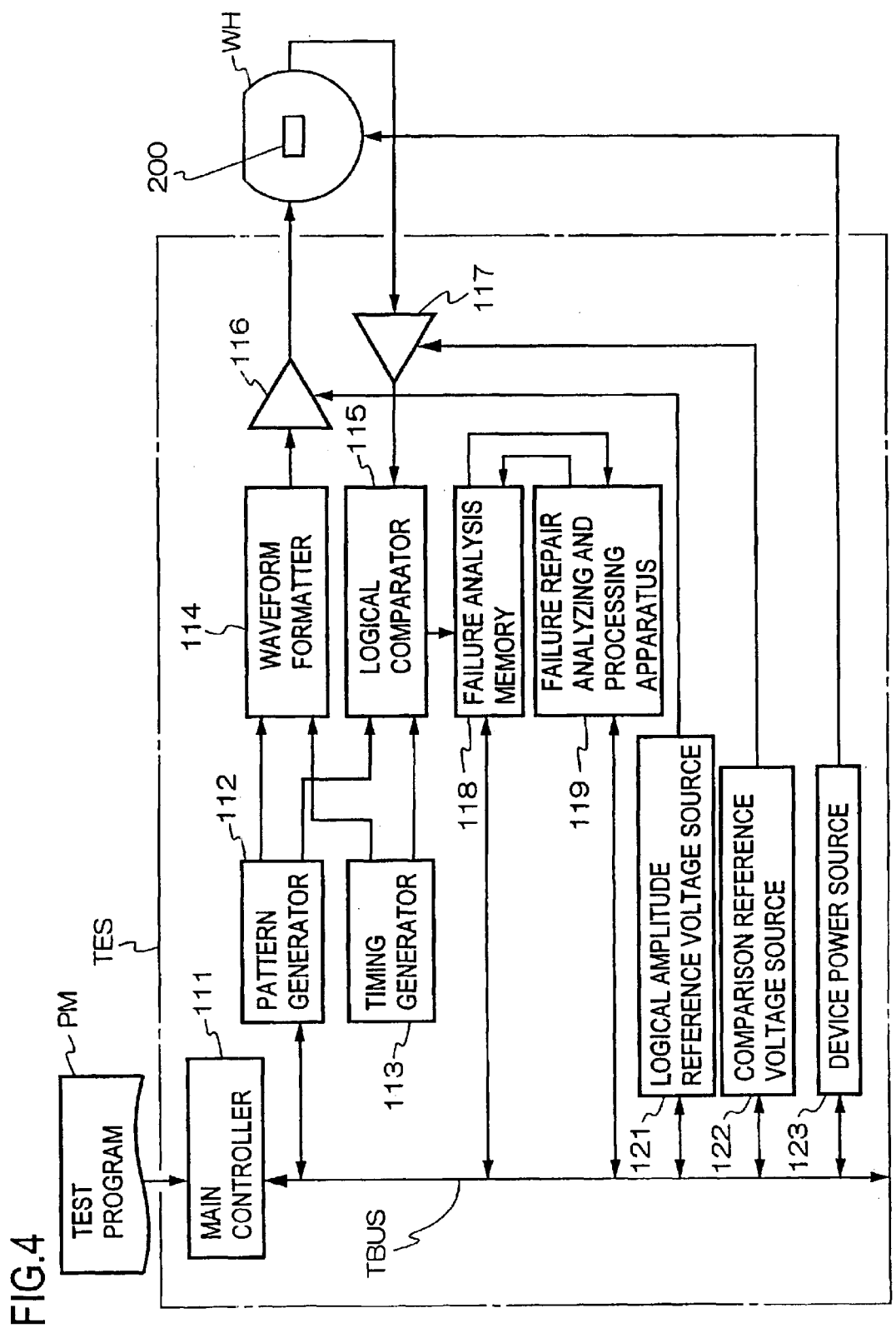
FIG. 4 is a block diagram showing an outline of a prior art general memory testing apparatus.

FIG. 1 is a block diagram showing a rough construction of an embodiment of the memory testing apparatus according to the present invention that is provided with a failure repair analyzing and processing apparatus using a method of analyzing and processing a repair of failure in a memory according to the present invention, and FIG. 2 is a block diagram showing a detailed construction of the failure repair analyzing and processing apparatus shown in FIG. 1. In this memory testing apparatus, a failure analysis memory 118 may be one that has the same construction as that of the prior art failure analysis memory 118 already discussed with reference to FIG. 6, and so the detailed construction thereof is not shown. Further, in FIGS. 1 and 2, elements and portions corresponding to those shown in FIG. 5 will be denoted by the same reference characters attached thereto, and explanation thereof will be omitted unless necessary.

This embodiment is characterized in that a failure repair analyzing and processing apparatus 119 is constituted by a control part 10, two (first and second) repair analysis units 20A and 20B, an access controller 30, a data distributor 40, and a unit select signal generator 50, and in that an unprocessed data bit detector 11 and a data bit update device 12 are further provided in the control part 10.

Figure 5:
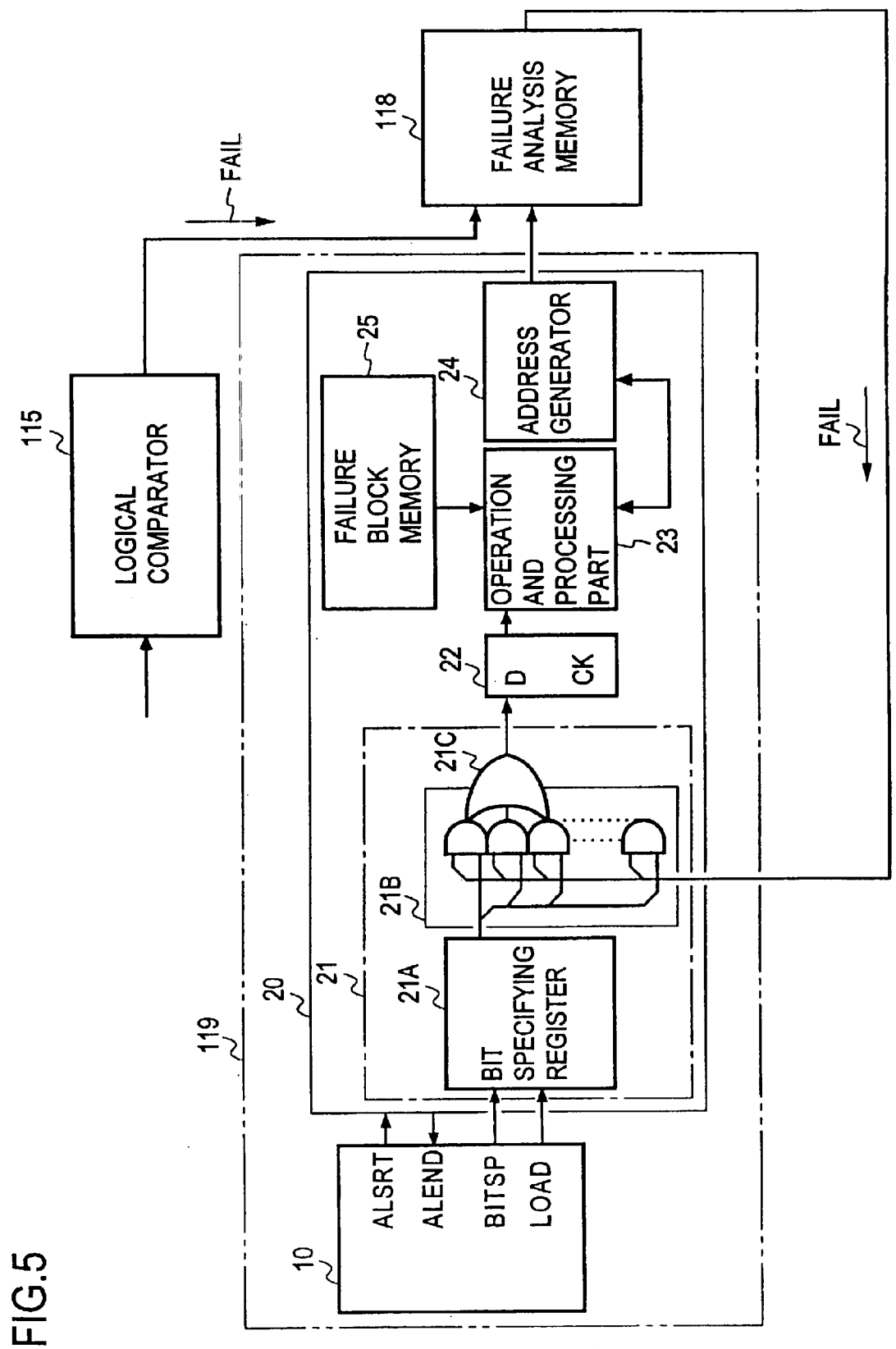
FIG. 5 is a block diagram showing a detailed construction of the failure repair analyzing and processing apparatus used in the memory testing apparatus shown in FIG. 4.
Figure 6:
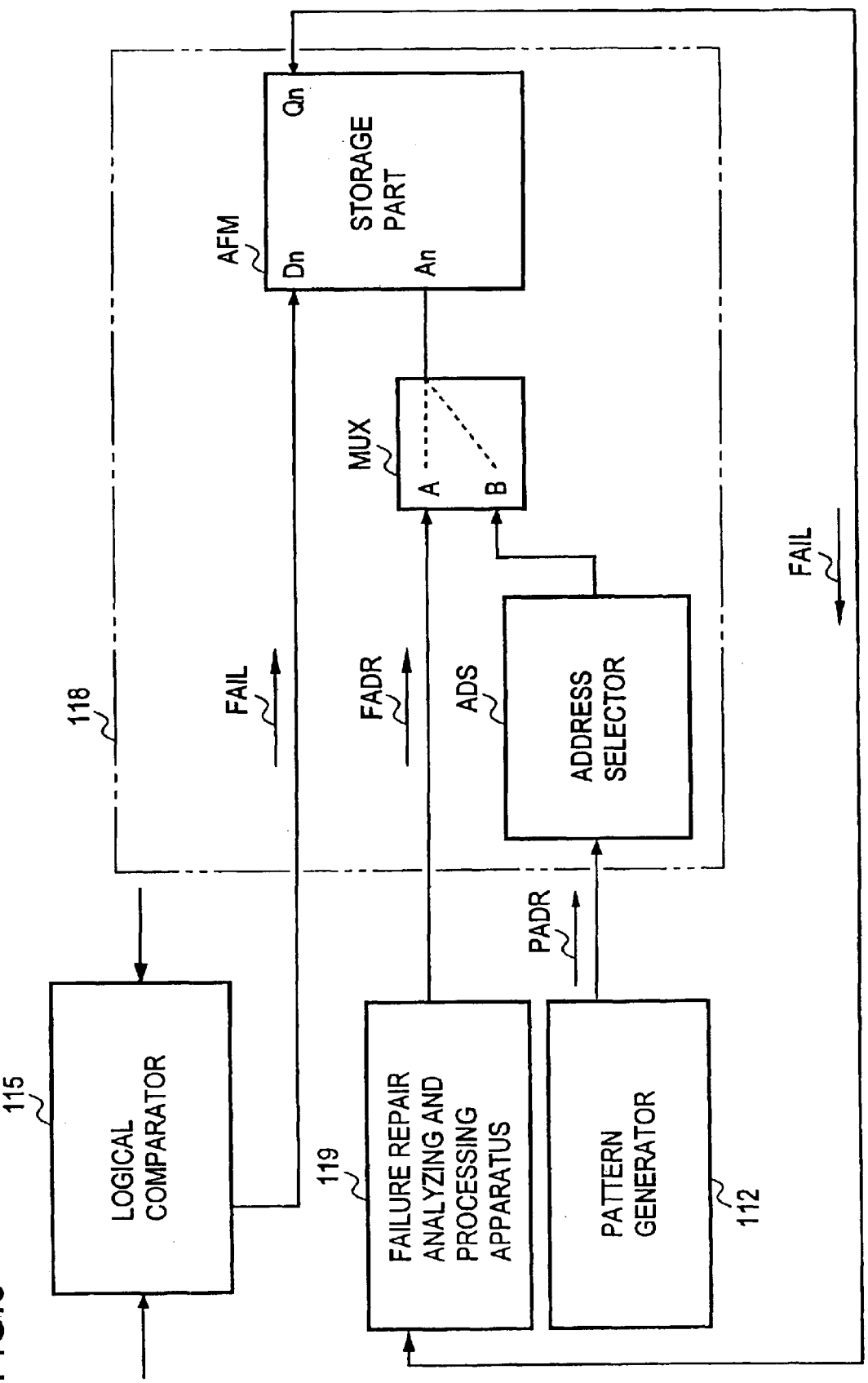
FIG. 6 is a block diagram showing a detailed construction of the failure analysis memory used in the memory testing apparatus shown in FIG. 5.
Figure 7:
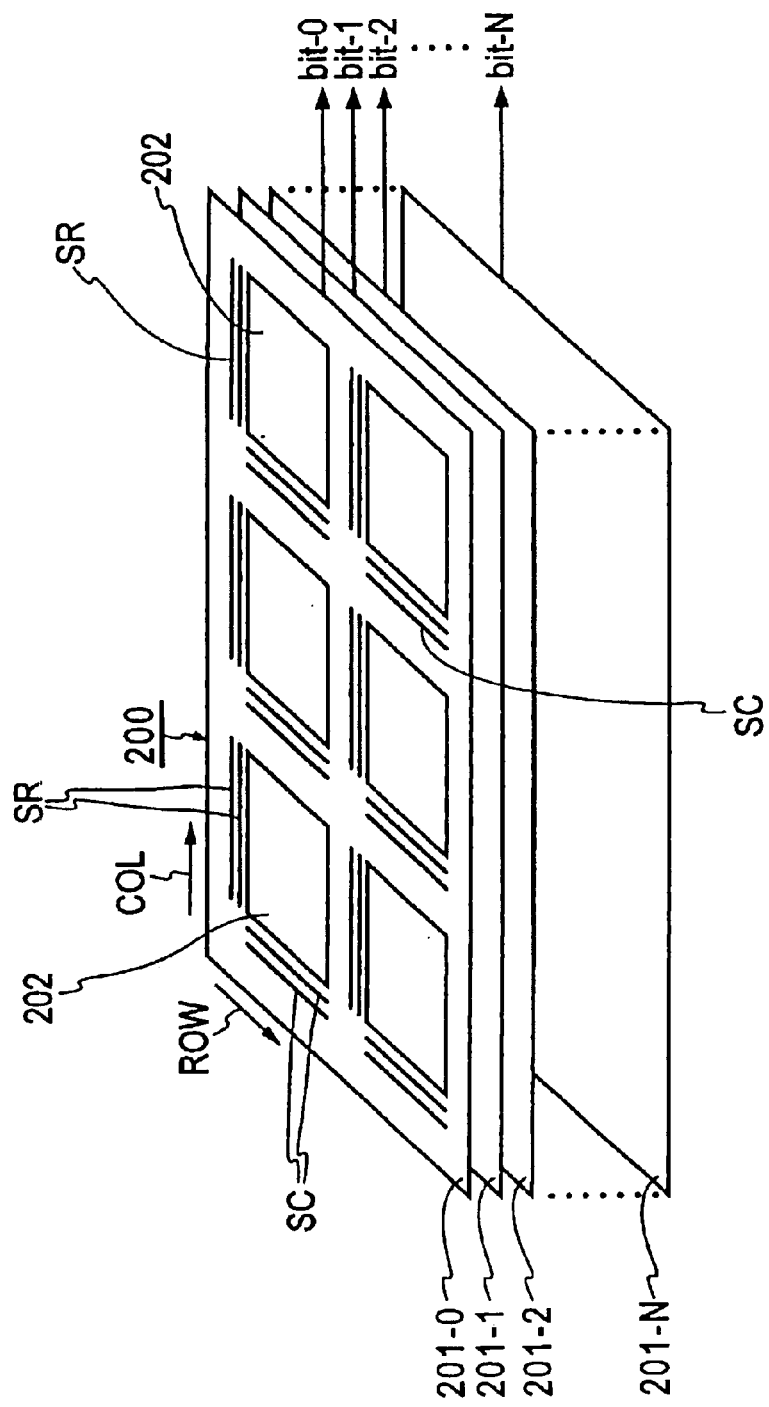
FIG. 7 is a perspective view for explaining a construction of the multi-bit memory having redundancy structure.

The construction of each of the first and second repair analysis units 20A and 20B may be one that has the same construction as that of the prior art repair analysis unit 20 shown in FIG. 5. Therefore, in this embodiment, too, as shown in FIG. 2, each of the first and second repair analysis units 20A and 20B comprises: a bit specifying part 21 constituted by a bit specifying register 21A, a group of AND gates 21B and an OR gate 21C for performing a logical addition (OR) of the AND gate group 21B; a latch circuit 22 for temporarily storing data outputted from the bit specifying part 21; an operation and processing part 23 for performing an operation or computation of data read out from the latch circuit 22; a failure block memory 25 for storing a memory cell array from which a failure memory cell is detected; and an address generator 24 for generating an address signal for accessing an address of the failure analysis memory 118 in carrying out a repair analysis and processing.

The first and second repair analysis units 20A and 20B start their repair analyzing operations when they receive analysis start signals ALSRT1 and ALSRT2 respectively from the control part 10, and cause their address generators 24 to start to generate address signals FADR1 and FADR2, respectively. The address signals FADR1 and FADR2 generated respectively from their address generators 24 are applied to the failure analysis memory 118 through the access controller 30. The access controller 30 switches alternately the address signals FADR1 and FADR2 outputted respectively from the first and second repair analysis units 20A and 20B to apply one address signal to the failure analysis memory 118. As a result, the two repair analysis units 20A and 20B alternately access the failure analysis memory 118 to read out from its storage part AFM failure data FAIL corresponding to failure memory cell information. The access controller 30 may be constituted of, for example, a multiplexer.

The failure data FAIL read out from the failure analysis memory 118 are sent to the data distributor 40 of the failure repair analyzing and processing apparatus 119 through a transmission line 60. The data distributor 40 comprises: two (first and second) latch circuits 41 and 42, and an inverter 43; and the failure data FAIL are applied to respective data input terminals D of these latch circuits 41 and 42. The other input terminals G of the latch circuits 41 and 42 are inverting input terminals, respectively. The inverting input terminal G of the first latch circuit 41 is connected directly to an output terminal of the unit select signal generator 50, and the inverting input terminal G of the second latch circuit 42 is connected to the output terminal of the unit select signal generator 50 through the inverter 43.

The unit select signal generator 50 comprises: an OR gate to which a first clock signal CK1 and a second clock signal CK2 are applied; and a latch circuit having its clock terminal CK to which an output signal from the OR gate is applied. The unit select signal generator 50 generates a unit select signal UNSEL for selecting the first repair analysis unit 20A or the second repair analysis unit 20B. This unit select signal UNSEL outputted from the unit select signal generator 50 is supplied to the inverting input terminals G of the first and second latch circuits 41 and 42 of the data distributor 40 as mentioned above as well as supplied to a control terminal of the access controller 30 as shown in FIG. 1.

The data distributor 40 is configured such that it alternately supplies the failure data FAIL inputted from the failure analysis memory 118 to the first and second repair analysis unit 20A and 20B under the control of the unit select signal UNSEL. Specifically explaining, in case the first repair analysis unit 20A gives an address signal FADR1 to the failure analysis memory 118 to access it, the data distributor 40 is arranged to input the failure data read out from that address of the failure analysis memory 118 to the first repair analysis unit 20A. In case the second repair analysis unit 20B gives an address signal FADR2 to the failure analysis memory 118 to access it, the data distributor 40 is arranged to input the failure data read out from that address of the failure analysis memory 118 to the second repair analysis unit 20B.

When the repair analyzing operation for one data bit (one memory cell array group) has been completed, the first and second repair analysis units 20A and 20B send respective analysis end signals ALEND1 and ALEND2 to the control part 10.

Next, the operation of the failure repair analyzing and processing apparatus 119 constructed as discussed above will be further explained with reference to a timing chart shown in FIG. 3.

The first and second clock signals CK1 and CK2 inputted to the unit select signal generator 50 are generated with the same period of time duration 2T, as shown respectively in FIGS. 3A and 3C, and have a phase difference of time duration T between them. Accordingly, the first and second clock signals CK1 and CK2 are alternately inputted to the unit select signal generator 50 with a period T.

The unit select signal generator 50 generates a unit select signal UNSEL shown in FIG. 3E, that inverts from logical "1" to logical "0" at each timing of the leading (rise) edge of the first clock CK1 as well as inverts from logical "0" to logical "1" at each timing of the leading edge of the second clock CK2. This unit select signal UNSEL becomes a rectangular or square wave in which logical "0" and logical "1" are alternated for each time duration T, as shown in FIG. 3E, in this embodiment since the first and second clock signals CK1 and CK2 are generated with the period 2T and with the phase difference T between them.

In the first repair analysis unit 20A, the operation and processing part 23 reads out the stored data in the failure block memory 25 therefrom, and if any failure memory cell does not exist in a memory cell array of a data bit (memory cell array group) for which the first repair analysis unit 20A intends to execute the repair analysis and processing, the operation and processing part 23 controls such that the address generator 24 does not generate an address signal to access that memory cell array and generates an address signal to access a subsequent memory cell array to be analyzed and processed next time. That is, the repair analysis and processing for each of memory cell arrays from which no failure memory cell has been detected is not carried out and the repair analysis and processing for a subsequent memory cell array to be analyzed and processed next time is executed at once. The address generator 24 generates an address signal FADR1 (addresses a, a+1, a+2, a+3, . . . , as shown in FIG. 3B, in synchronism with the leading edge of the first clock signal CK1.

Likewise, in the second repair analysis unit 20B, the operation and processing part 23 reads out the stored data in the failure block memory 25 therefrom, and if any failure memory cell does not exist in a memory cell array of a data bit (a data bit different from the data bit for which the first repair analysis unit 20A intends to execute the repair analysis and processing) for which the second repair analysis unit 20B intends to execute the repair analysis and processing, the operation and processing part 23 controls such that the address generator 24 does not generate an address signal to access that memory cell array and generates an address signal to access a subsequent memory cell array to be analyzed and processed next time. The address generator 24 of the second repair analysis unit 20B generates an address signal FADR2 (addresses b, b+1, b+2, b+3, . . . ), as shown in FIG. 3D, in synchronism with the leading edge of the second clock signal CK2.

The access controller 30 alternately switches the address signal FADR1 and the address signal FADR2 in synchronism with the unit select signal UNSEL at intervals of the period T as shown in FIG. 3F, and outputs the address signals alternately. As a result, an address signal FADR in sequence of addresses a, b, a+1, b+1, a+2, b+2, a+3, b+3, . . . is outputted from the access controller 30 and is applied to the failure analysis memory 118. Since the switching rate of the address signals FADR1 and FADR2 is equal to ½ of the period 2T of each of the first clock signal CK1 and the second clock signal CK2, the address signal FADR consisting of the address signals FADR1 and FADR2 that are switched at a rate twice the generation rate of the clock signal is applied to the failure analysis memory 118.

The failure analysis memory 118 is accessed by the address signal FADR in which the addresses are switched at a rate twice the generation rate of the clock signal, and accordingly, the failure data FAIL in which failure data FD(a), FD(a+1), FD(a+2), . . . and failure data FD(b), FD(b+1), FD(b+2), . . . existing in two respective data bits alternate with each other with the period T is read out from the storage part AFM of the memory 118 in sequence of FD(a), FD(b), FD(a+1), FD(b+1), FD(a+2), FD(b+2), . . . , as shown in FIG. 3G. That is, since the read-out period also becomes T, the failure data FAIL in which the failure data existing in two respective data bits are switched at a rate twice the generation rate of the clock signal is read out. The failure data in which the respective failure data are switched at a rate twice that of the clock signal is inputted to the data distributor 40 through the transmission line 60.

In the data distributor 40, the first and second latch circuits 41 and 42 alternately take the failure data FAIL therein under the control of the unit select signal UNSEL shown in FIG. 3E. These latch circuits 41 and 42 hold the failure data taken therein, respectively, until the next first and second clock signals CLK1 and CLK2 are applied to the latch circuits 41 and 42 respectively, and hence the failure data FAIL1 latched in the first latch circuit 41 is switched at intervals of the period 2T as shown in FIG. 3H, and likewise, the failure data FAIL2 latched in the second latch circuit 42 is also switched at intervals of the period 2T as shown in FIG. 3I.

The failure data FAIL1 and FAIL2 latched respectively in the first and second latch circuits 41 and 42 are supplied to the other input terminals of the AND gate groups 21B of the respective bit specifying parts 21 of the first and second repair analysis units 20A and 20B, respectively. As a result, respective failure data in the data bits (memory cell array groups) specified respectively by the bit specifying registers 21A, 21A of the two repair analysis units 20A, 20B are given to the latch circuits 22, 22 through the respective OR gates 21C, 21C, and are latched therein. FIG. 3IJ shows the failure data FF1 latched in the latch circuit 22 of the first repair analysis unit 20A, and FIG. 3K shows the failure data FF2 latched in the latch circuit 22 of the second repair analysis unit 20B.

Each of the operation and processing parts 23, 23 of the first and second repair analysis units 20A and 20B adds up in number the failure data taken therein in each address line for each memory cell array 202, and operates or computes and processes as to whether an address line on which one or more failure memory cells exist can be repaired by use of spare lines SC, SR provided on each memory cell array 202. Moreover, each operation and processing part 23 reads out the stored data in the failure block memory 25 therefrom, and in case of a memory cell array from which any failure memory cell has not been detected, the repair analysis and processing for that memory cell array from which no failure memory cell has been detected is not performed and the repair analysis and processing for a subsequent memory cell array to be analyzed and processed next time is carried out at once.

In this manner, this embodiment is constructed such that the failure analysis memory 118 is accessed at a rate twice the generation rate of the address signals FADR1 and FADR2 generated from the respective address generators 24, 24 of the first and second repair analysis units 20A and 20B, and the respective failure data FAIL1 and FAIL2 of two data bits are read out in sequence from the addresses of the failure analysis memory 118 to be taken in the first and second repair analysis units 20A and 20B in which the analysis and processing as to whether each memory cell array of the plural data bits (memory cell array groups) 201-0, 201-1, 201-2, . . . of the memory under test 200 can be repaired by use of the spare lines SC, SR is carried out. In other words, the embodiment is constructed that the first and second repair analysis units 20A and 20B execute the respective failure repair analyses and processings one data bit by one data bit (one memory cell array group by one memory cell array group) in parallel with each other at the same time.

Here, a transmission line 61 for transmitting the address signal FADR from the access controller 30 to the failure analysis memory 118 and the transmission line 60 for transmitting the failure data FAIL from he failure analysis memory 118 to the failure repair analysis and processing apparatus 119 are multi-bit transmission lines of, for example, 16 bits or 32 bits or so, respectively. Accordingly, it is difficult to provide these transmission lines independently or separately in the first and second repair analysis units 20A and 20B. For this reason, in this embodiment, each of the transmission lines 60 and 61 is used by time division or sharing so that the two repair analysis units 20A and 20B can utilize them together.

Though the transmission lines 60 and 61 are utilized by time division, both the repair analysis units 20A and 20B are provided with their own address generators 24, 24, and hence, when the repair analysis units 20A and 20B receive the analysis start signals ALSRT1 and ALSRT2 respectively from the control part 10, they can start the respective failure repair analyses and processings independently.

The first and second repair analysis units 20A and 20B transmit, when they have completed the respective failure repair analyses and processings for the specified data bits, the analysis end signals ALEND1 and ALEND2 respectively to the control part 10. The control part 10 starts, when it receives the analysis end signals ALEND1 and ALEND2, an unprocessed data bit detector 11 to search as to whether an unprocessed data bit exists or not. When an unprocessed data bit has been detected, the control part 10 gives information of that unprocessed data bit to the data bit update device 12. The data bit update device 12 updates a bit specifying signal BITSP that is given to the bit specifying register 21A of the repair analysis unit 20A or 20B from which the analysis end signal ALEND1 or ALEND2 has been transmitted to the detected unprocessed data bit.

Accordingly, in the state that one repair analysis unit, for example, the first repair analysis unit 20A does not end the failure analysis and processing for a memory cell array group corresponding to a data bit that was assigned to the first repair analysis unit 20A, for example, the failure analysis and processing for the bit 1 memory cell array group 201-0, if the second repair analysis unit 20B has completed the failure analysis and processing for a memory cell array group corresponding to a data bit that was assigned to the second repair analysis unit 20B, for example, the failure analysis and processing for the bit 2 memory cell array group 201-1, then the control part 10 specifies the third data bit bit-2 to the second repair analysis unit 20B thereby to cause the second repair analysis unit 20B to execute the failure analysis and processing for the bit 3 memory cell array group 201-2. Thereafter, when the first repair analysis unit 20A has completed the failure analysis and processing for the bit 1 memory cell array group 201-0, the control part 10 specifies the fourth data bit bit-3 to the first repair analysis unit 20A thereby to cause the first repair analysis unit 20A to perform the failure analysis and processing for the bit 4 memory cell array group 201-3.

In such manner, according to the embodiment discussed above, both the repair analysis units 20A and 20B can receive respective assignments of data bits independently thereby to carry out their repair analysis and processing operations without being affected by the delay of the repair analysis and processing operation of one repair analysis unit. Accordingly, even if the processing speed of one repair analysis unit that executes the failure repair analysis and processing for a memory cell array in which many failure memory cells exist is lowered, the other repair analysis unit runs on its failure repair analysis and processing operation. Consequently, the failure repair analysis and processing time of the whole of the apparatus is reduced and the failure repair analysis and processing can be carried out at high speed.

In other words, the two repair analysis units are concurrently operated in parallel with each other, and in case one repair analysis unit has completed the failure repair analysis and processing for a data bit (memory cell array group) prior to a data bit for which the other repair analysis unit is performing the failure repair analysis and processing, the one repair analysis unit can receive assignment of a data bit that the failure repair analysis and processing therefor is to be executed next time, and thereafter, it can execute the repair analysis and processing for that data bit. Accordingly, even if there occurs a delay in the processing time of one repair analysis unit that performs the repair analysis and processing for a data bit in which many failure memory cells exist, the other repair analysis unit can carry out the failure repair analysis and processing for the next data bit prior to the one repair analysis unit. As a result, even if a number of failure memory cells exist biasedly in a specified memory cell array, the influence thereof is reduced, and the failure repair analysis and processing can be completed in a short time as a whole.

In the aforementioned embodiment, for clarity of explanation, the two repair analysis units 20A and 20B are provided in the failure repair analysis and processing apparatus 119. However, it is needless to say that three or more repair analysis units having the same construction with one another may be provided in the failure repair analysis and processing apparatus 119. If the number of repair analysis units is further increased, the failure repair analysis and processing may be carried out at higher speed. For example, if the number of failure repair analysis units is N, the failure repair analysis time can be reduced to 1/N.

In addition, though there is described the case that the analysis and processing is carried out as to whether a failure memory cell or cells detected from each of the data bits of the multi-bit memory of redundancy structure can be repaired or not, the present invention may be applied to a case that the analysis and processing is carried out as to whether a failure memory cell or cells detected from a memory of redundancy structure other than multi-bit memories (that is, one bit memory of redundancy structure) can be repaired or not, and the failure repair analysis and processing may be carried out at high speed as in the above embodiment.

In case a memory under test is not a multi-bit memory, respective failure data representing failure memory cells of plural memory cell arrays of the memory under test are stored in plural data bit memory areas of the failure analysis memory, respectively, the plural data bit memory areas of the failure analysis memory being ones in which, in case that the memory under test is a multi-bit memory, respective failure data each representing failure memory cells for each data bit are stored. In other words, failure data representing a failure memory cell or cells of one memory cell array of the memory under test are stored only in corresponding one data bit memory area of the failure analysis memory 118. Accordingly, in case the memory under test is not a multi-bit memory, respective failure data read out from the plural data bit memory areas of the failure analysis memory 118 are ones that have been detected respectively from the plural memory cell arrays of the tested memory.

As is clear from the foregoing, according to the present invention, a plurality of repair analysis units as well as a common failure analysis memory are provided, and these repair analysis units are concurrently operated in parallel with each other to carry out their repair analyses and processings for a plurality of data bits or a plurality of memory cell arrays. Accordingly, there are obtained remarkable advantages that the repair analysis and processing time can be greatly reduced and hence the failure repair analysis and processing can be executed at high speed. Thus, there can be provided a method of analyzing and processing a repair of failure in a memory and a memory testing apparatus using this method, that are capable of coping with the increasing storage capacity of and the increasing number of bits of a memory.

While the present invention has been described with regard to the preferred embodiment shown by way of example, it will be apparent to those skilled in the art that various modifications, alterations, changes, and/or minor improvements of the embodiment described above can be made without departing from the spirit and the scope of the present invention. Accordingly, it should be understood that the present invention is not limited to the illustrated embodiment, and is intended to encompass all such modifications, alterations, changes, and/or minor improvements falling within the scope of the invention defined by the appended claims.

What is claimed is:

1. A method of analyzing and processing a repair of failure that is carried out in a memory testing apparatus which comprises: a failure analysis memory for storing therein failure data representing a failure memory cell or cells of a memory under test having redundancy structure; and a failure repair analyzing and processing apparatus for analyzing as to whether the failure memory cell or cells of the memory under test can be repaired on the basis of the failure data read out from the failure analysis memory after the testing has been completed, said method comprising the steps of:

reading out failure data respectively from plural specified data bit memory areas of the failure analysis memory in sequence and distributing them to corresponding plural repair analysis units respectively; and operating concurrently the plural repair analysis units in parallel with each other and causing the units to carry out concurrently their repair analyses and processings for the failure memory cell or cells corresponding to the failure data read out from the failure analysis memory in parallel with each other.

2. The method of analyzing and processing a repair of failure as set forth in claim 1, further including: the step of checking whether there exists an unprocessed data bit memory area for which the repair analysis and processing is not executed or not, and wherein in case an unprocessed data bit memory area has been detected, each of the repair analysis units performs, when it has completed the repair analysis and processing for failure data of a data bit memory area assigned to that unit, the repair analysis and processing for failure data of the detected unprocessed data bit memory area at once.

3. The method of analyzing and processing a repair of failure as set forth in claim 1 or 2, wherein said step of reading out failure data respectively from plural specified data bit memory areas of the failure analysis memory in sequence includes the step of: switching in sequence respective address signals accessing to plural specified data bit memory areas, that are outputted respectively from the plural repair analysis units to apply them to the failure analysis memory; and wherein the period that the plural address signals are switched in sequence is a period that the period of each address signal accessing to corresponding one specified data bit memory area is divided by the number of specified data bit memory areas; and wherein the failure data read out from the failure analysis memory are failure data that are switched in sequence at intervals of the same period as the switching period of the address signals applied to the failure analysis memory.

4. A memory testing apparatus comprising:

a failure analysis memory for storing therein failure data representing a failure memory cell or cells of a memory under test having redundancy structure;

a plurality of repair analysis units, each being constructed such that it specifies any data bit memory area in plural data bit memory areas of the failure analysis memory, reads out failure data stored in the specified data bit memory area in respective failure data stored in the plural data bit memory areas of the failure analysis memory, and analyzes as to whether a memory cell array or arrays associated with the read-out failure data can be repaired or not;

access control means for switching in sequence respective address signals outputted from the plural repair analysis units to apply them to the failure analysis memory in sequence;

data distributing means for distributing respective failure data read out from the plural specified data bit memory areas of the failure analysis memory to the corresponding plural repair analysis units, respectively; and a control part that controls respective repair analysis and processing operations of the plural repair analysis units.

5. The memory testing apparatus as set forth in claim 4, wherein each of the plural repair analysis units is provided with its own address generator, and each repair analysis unit can access the failure analysis memory separately and independently of the operation of other repair analysis unit or units by generating an address signal accessing to a specified data bit memory area from its own address generator.

6. The memory testing apparatus as set forth in claim 4, wherein the access control means is arranged such that it switches in sequence respective address signals accessing to plural specified data bit memory areas, that are outputted respectively from the plural repair analysis units to apply them to the failure analysis memory; and wherein the period that the plural address signals are switched in sequence is a period that the period of each address signal accessing to corresponding one specified data bit memory area is divided by the number of specified data bit memory areas; and wherein the failure data read out from the failure analysis memory are failure data that are switched in sequence at intervals of the same period as the switching period of the address signals applied to the failure analysis memory.

7. The memory testing apparatus as set forth in any one of claim 4, 5 or 6, wherein the control part applies respective analysis start signals, respective bit specified signals, and respective load signals to the plural repair analysis units, respectively, and receives a analysis end signal from each of the plural repair analysis units, thereby to control respective repair analysis and processing operations of the plural repair analysis units; and the control part further comprises:

unprocessed data bit detecting means for detecting, each time a repair analysis unit that has completed the repair analysis and processing operation for a memory cell array or arrays associated with failure data of a specified data bit memory area transmits an analysis end signal, whether there exists an unprocessed data bit memory area for which the repair analysis and processing is not executed or not; and data bit update means for updating, in case an unprocessed data bit memory area has been detected, a bit specifying signal being applied to a repair analysis unit that has completed the repair analysis and processing operation to a bit specifying signal to be applied to the unprocessed data bit memory area.

8. The memory testing apparatus as set forth in any one of claim 4, 5 or 6, wherein the memory under test is a multi-bit memory; and wherein the failure analysis memory includes at least the same number of data bit memory areas as the number of bits of the memory under test, and failure data of each of the data bits of the multi-bit memory under test are stored in corresponding one data bit memory area of the failure analysis memory.

9. The memory testing apparatus as set forth in any one of claim 4, 5 or 6, wherein the memory under test is a one-bit memory; and wherein the failure analysis memory includes at least the same number of data bit memory areas as the number of memory cell arrays of the memory under test, and failure data of each of the memory cell arrays of the memory under test are stored in corresponding one data bit memory area of the failure analysis memory.

* * * * *